US008724321B2

United States Patent
Nakamichi et al.

(10) Patent No.: US 8,724,321 B2
(45) Date of Patent: May 13, 2014

(54) DISPLAY APPARATUS

(75) Inventors: Masaya Nakamichi, Kizugawa (JP); Shohei Takahashi, Daito (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 138 days.

(21) Appl. No.: 12/959,827

(22) Filed: Dec. 3, 2010

(65) Prior Publication Data

US 2011/0075361 A1 Mar. 31, 2011

Related U.S. Application Data

(63) Continuation of application No. PCT/JP2009/057187, filed on Apr. 8, 2009.

(30) Foreign Application Priority Data

Jun. 3, 2008 (JP) ................................. 2008-145443

(51) Int. Cl.
 *H05K 7/20* (2006.01)
(52) U.S. Cl.
 USPC .......................................... 361/696; 361/695
(58) Field of Classification Search
 USPC ........................................................ 361/695
 See application file for complete search history.

(56) References Cited

U.S. PATENT DOCUMENTS

| | | | | |
|---|---|---|---|---|
| 4,772,098 A | * | 9/1988 | Ogawa | 349/5 |
| 4,787,737 A | * | 11/1988 | Ogawa et al. | 353/57 |
| 6,198,222 B1 | * | 3/2001 | Chang | 313/582 |
| 6,493,440 B2 | * | 12/2002 | Gromatzky et al. | 379/161 |
| 6,774,872 B1 | * | 8/2004 | Kawada et al. | 345/60 |
| 7,259,964 B2 | * | 8/2007 | Yamamura et al. | 361/697 |
| 7,755,893 B2 | * | 7/2010 | Yanagawa et al. | 361/695 |
| 2009/0310059 A1 | * | 12/2009 | Kim et al. | 349/58 |

FOREIGN PATENT DOCUMENTS

| | | |
|---|---|---|
| JP | 03-175483 A | 7/1991 |
| JP | 04-230099 A | 8/1992 |
| JP | 07-103675 A | 4/1995 |
| JP | 09-233406 A | 9/1997 |
| JP | 09-307257 A | 11/1997 |
| JP | 11-065459 A | 3/1999 |
| JP | 2001-282114 A | 10/2001 |
| JP | 2002-057481 A | 2/2002 |
| JP | 2003-008274 A | 1/2003 |
| JP | 2007-240646 A | 9/2007 |

OTHER PUBLICATIONS

Notification of Transmittal of the International Search Report (PCT / ISA/ 22 0), the International Search Report (PCT/ISA/210), and the Written Opinion from ISA (PCT/ISA/237) issued in PCT/JP2009/057187.
Office Action issued Nov. 13, 2012, in the counterpart Japanese application No. 2008-145442.
Office Action issued Sep. 4, 2012, in the counterpart Japanese application No. 2008-145442.
Translation and English Abstract for JP 11-065459 A, published Mar. 5, 1999.
Translation and English Abstract for JP 2007-240646 A, published Sep. 20, 2007.

* cited by examiner

*Primary Examiner* — William H Mayo, III
*Assistant Examiner* — Hiram E Gonzalez
(74) *Attorney, Agent, or Firm* — NDQ&M Watchstone LLP

(57) ABSTRACT

A display apparatus includes a liquid crystal display having a display panel, a housing, and a plurality of heat pipes. The housing has a sealing part and has aeration paths. The sealing part seals the display panel to box the display panel therein, while making a display screen of the display panel viewable from outside. The aeration paths are arranged outside the sealing part and communicate with the outside of the housing. The heat pipes extend from a rear surface of the display panel to the aeration paths.

7 Claims, 13 Drawing Sheets

DISPLAY APPARATUS

This application is a continuation application of Patent Cooperation Treaty Patent Application No. PCT/JP2009/057187 (filed on Apr. 8, 2009), which claims priority from Japanese patent application JP2008-145443 (filed on Jun. 3, 2008). All of which are hereby incorporated by reference herein.

BACKGROUND OF THE INVENTION

1. Field of the Invention

The present invention relates to a display apparatus, and particularly to a display apparatus for outdoor installation.

2. Description of Related Art

Conventionally, flat-panel displays such as a liquid crystal display (LCD) (for example, JP2005-286987 A1) have been widely used as monitors for image displays. However, most of the conventional LCDs are designed for indoor installation, and they are not designed for protection from weather or dust. Therefore, it was difficult to install a conventional LCD outside permanently.

However, in recent years, it has been desired to place LCDs permanently outdoors. This is because the thickness of the displays is small and the LCDs can display high resolution images. Since the thickness of the LCD is small, it can be installed on an outer wall of a building or in narrow places such as a bus stop shelters etc. Further, because the resolution of an LCD is high, can display a clear image even if a display screen is small.

Therefore, in order to protect the liquid crystal display from weather and dust, it was considered to seal a liquid crystal display in a housing.

However, when the LCD is sealed in a housing, heat cannot escape from inside to outside of the housing, so it is unable to cool the LCD by air naturally. Thus, temperature of the liquid crystal display is increased by the heat generated by its operation or sunlight. When the temperature of the liquid crystal display increases, the function of the liquid crystal degrades. As a result, it may not be able to display an image on the display screen (which is called a "black out").

SUMMARY OF THE INVENTION

A display apparatus according to the present invention comprises a flat display including a display panel, a housing, and one or a plurality of heat pipes. The housing has a sealing part and an aeration path. The sealing part seals around the display panel and makes a display screen of the display panel viewable from outside. The aeration path is arranged outside the sealing part and communicates with the outside of the housing. The heat pipes extend from a rear surface of the display panel to the aeration path.

DETAILED DESCRIPTION OF THE PREFERRED EMBODIMENT

The present invention embodied in a display apparatus or a display system is specifically described below with the reference to the drawings.

1. Image Display System

Figure 1:
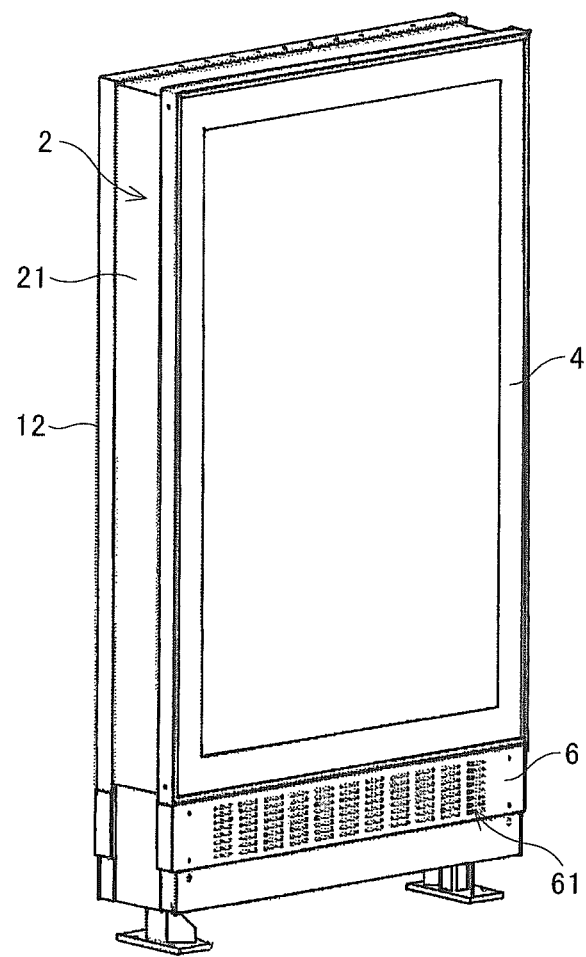
FIG. 1 is a perspective view of an image display system in which a display apparatus is installed.
Figure 2:
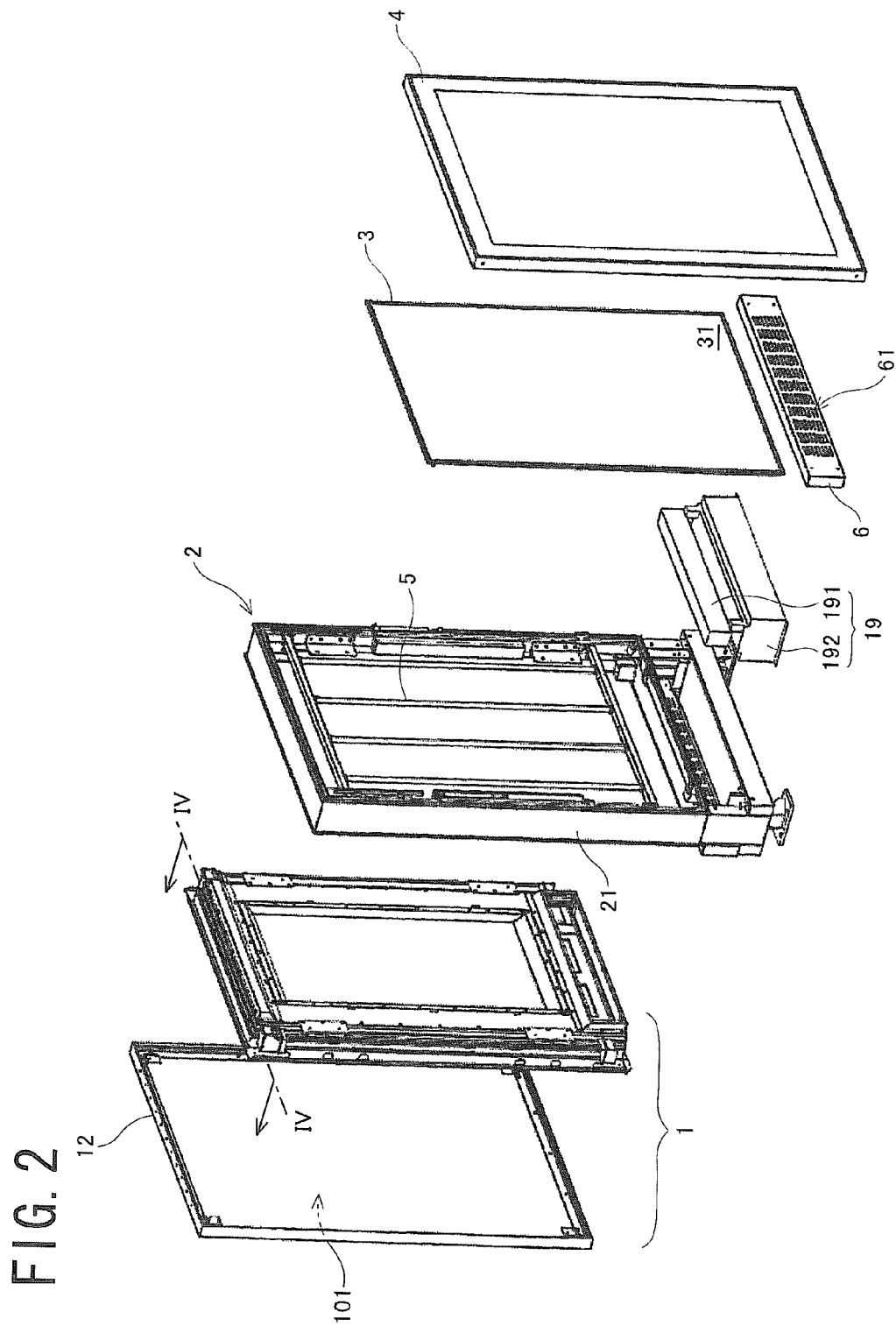
FIG. 2 is an exploded perspective view of the image display system.

An image display system has a flat rectangular solid-shaped appearance as shown in FIG. 1, and comprises a display apparatus 1, a base 2, a backboard 3, a cover 4, fluorescent light fittings 5 and an aeration plate 6 as shown in FIG. 2. Each element is described in detail below.

The display apparatus 1 can display a video on a screen 101, and has a liquid crystal display as described later. The detail of the display apparatus 1 is described later in section 2 "DISPLAY APPARATUS".

The base 2 includes a frame member 21. The member 21 has a structure that can insert the display apparatus 1 and the backboard 3 therein. When the apparatus 1 is attached to the base 2, the apparatus 1 is fitted in the member 21 with its screen (101) facing opposite to the backboard 3.

The fluorescent light fittings 5 are attached to the member 21 between the display apparatus 1 and the backboard 3.

The backboard 3 is a board formed from a material having an optical transparency, and has a front surface 31 where a light transmitting advertising film is attached. Thereby, a light emitted from the fittings 5 transmits the backboard 3 and illuminates the advertising film from its rear side. Since the advertising film has an optical transparency, by illuminating the advertising film with the fittings 5, figures or characters printed on the advertising film can be seen even in the night-times.

The cover 4 is attached to the base 2 covering the front surface 31 of the backboard 3. Thereby, the advertising film can be protected.

The aeration plate 6 is attached to the base 2 at a bottom side of the display apparatus 1. The plate 6 has a plurality of aeration holes 61.

Figure 3:
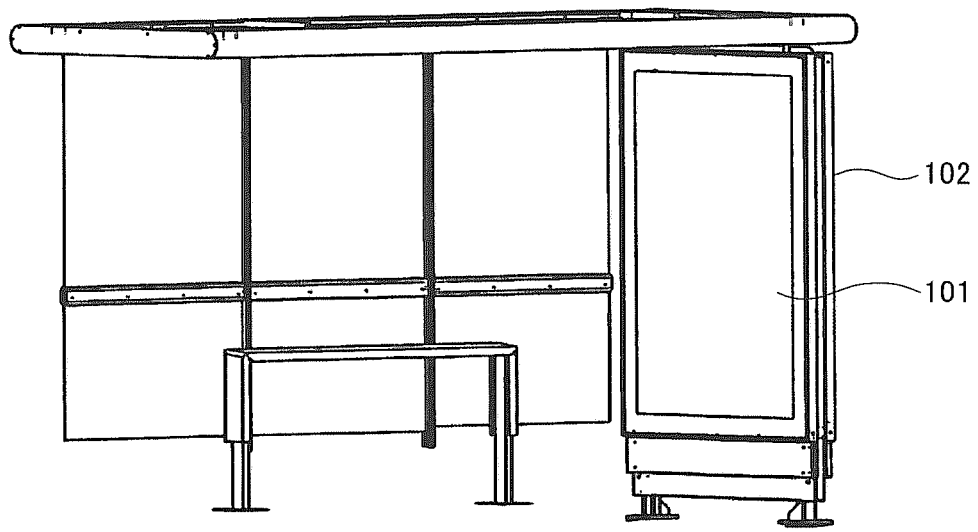
FIG. 3 is a front view showing an example of how the image display system is used.

The image display system mentioned above can be installed at a bus stop, for example, as shown in FIG. 3. The display system is placed with the screen 101 facing inside the bus stop.

According to this system, it can offer many kinds of information to the people waiting in a bus stop by using moving images, not only a still image. Further, by operating the apparatus remotely by wired or wireless communication, information displayed on the screen 101 can be easily updated, and the display systems installed in the bus stops can be managed collectively.

Furthermore, according to the above manner of installation, since an advertising film-side surface 102 faces to the exterior side of the bus stop, it can offer information to the people passing by the bus stop. Further, since the surface 102 faces outside and the screen 101 faces inside the bus stop, a driver of a car passing by the bus stop do not see the screen 101. Therefore, even when a moving image is displayed in the display apparatus 1, it can prevent the driver from attracting an attention to the moving image.

2. Display Apparatus

Figure 4:
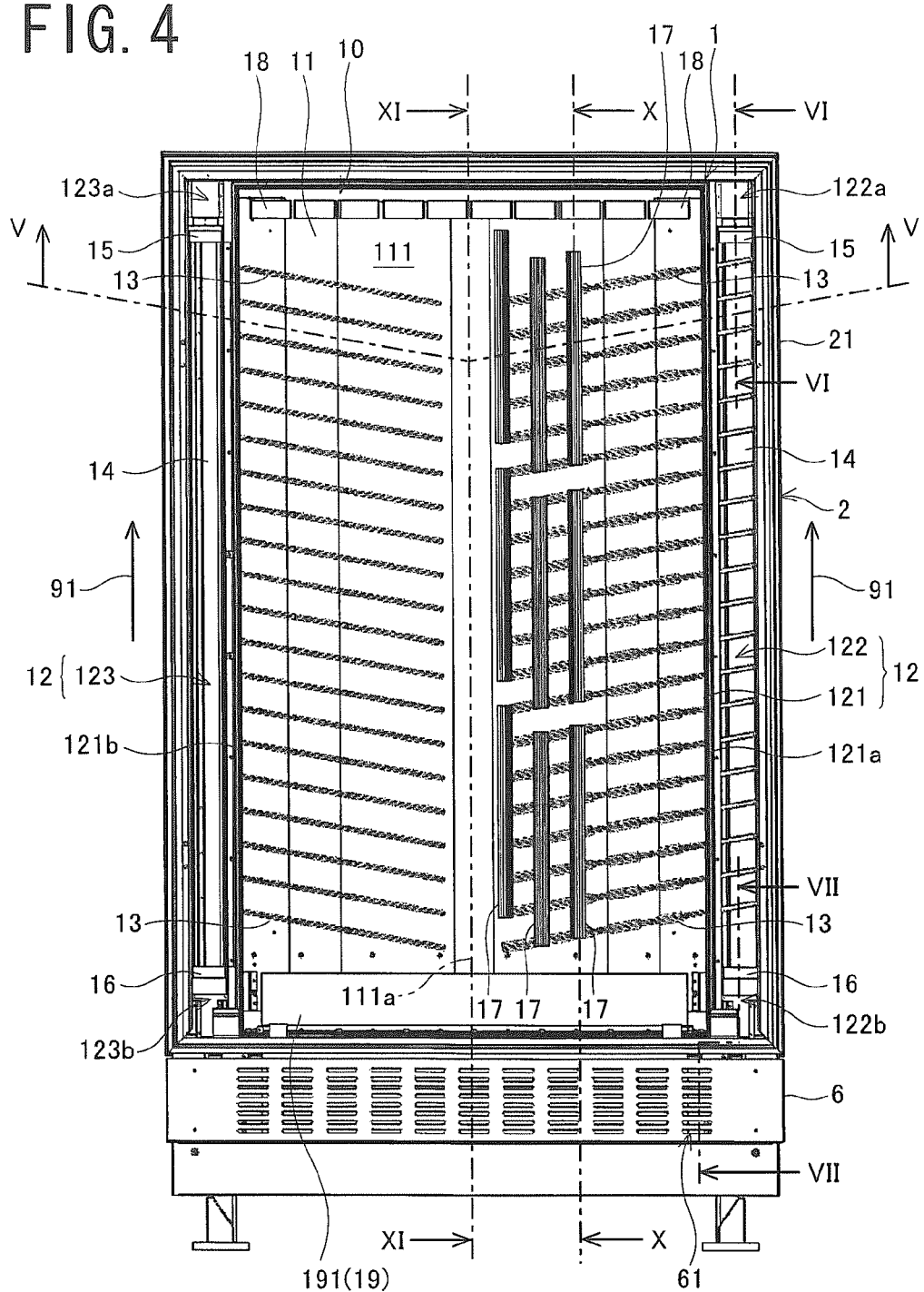
FIG. 4 is a cross sectional view of the display apparatus taken along the line IV-IV shown in FIG. 2.
Figure 5:
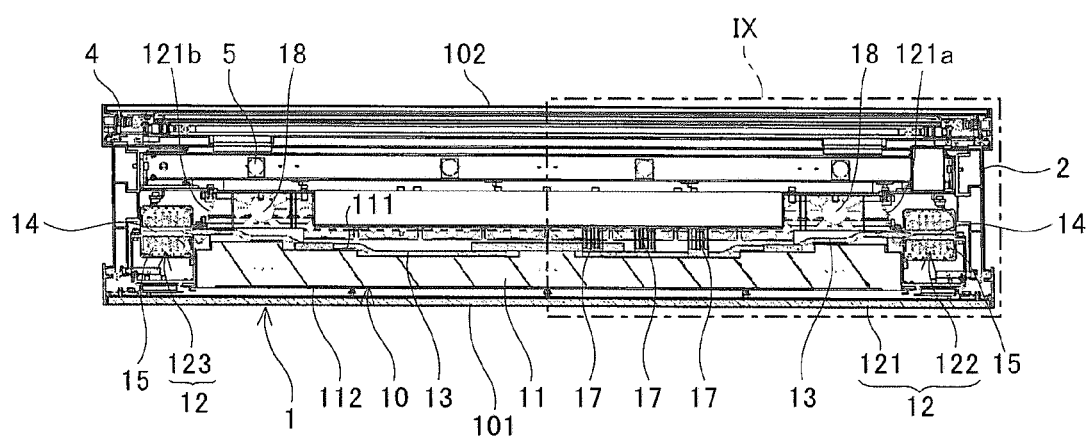
FIG. 5 is a cross sectional view of the display apparatus taken along the line V-V shown in FIG. 4.

The display apparatus 1 includes a liquid crystal display 10, a housing 12, a plurality of heat pipes 13, an air conditioner 19, circulating fans 18, radiating fins 14, aeration fans 15, 16 and heat collecting fins 17 as shown in FIGS. 4 and 5. Each of these elements is described in detail below.

<Liquid Crystal Display 10>

The liquid crystal display 10 is a flat-panel display, and has a display panel 11. Depending on its usage, various forms of display panel 11 can be used. The display panel 11 has a vertically-long rectangular shape so that the image display system can be installed in narrow places such as bus stops. Further, the display panel 11 tends to be high temperature because it tends to generate heat especially on a display screen 112 side (cf. FIG. 5).

<Housing 12>

The housing 12 has a accommodation part 121 as well as aeration paths 122, 123. The accommodation part 121 seals around the display panel 11 to box the display panel 11 therein, while making the display screen 112 (cf. FIG. 5) of the display panel 11 viewable from outside. Thereby, the display panel 11 can be protected from weather and dust even when the display apparatus 1 is installed outdoors.

Figure 11:
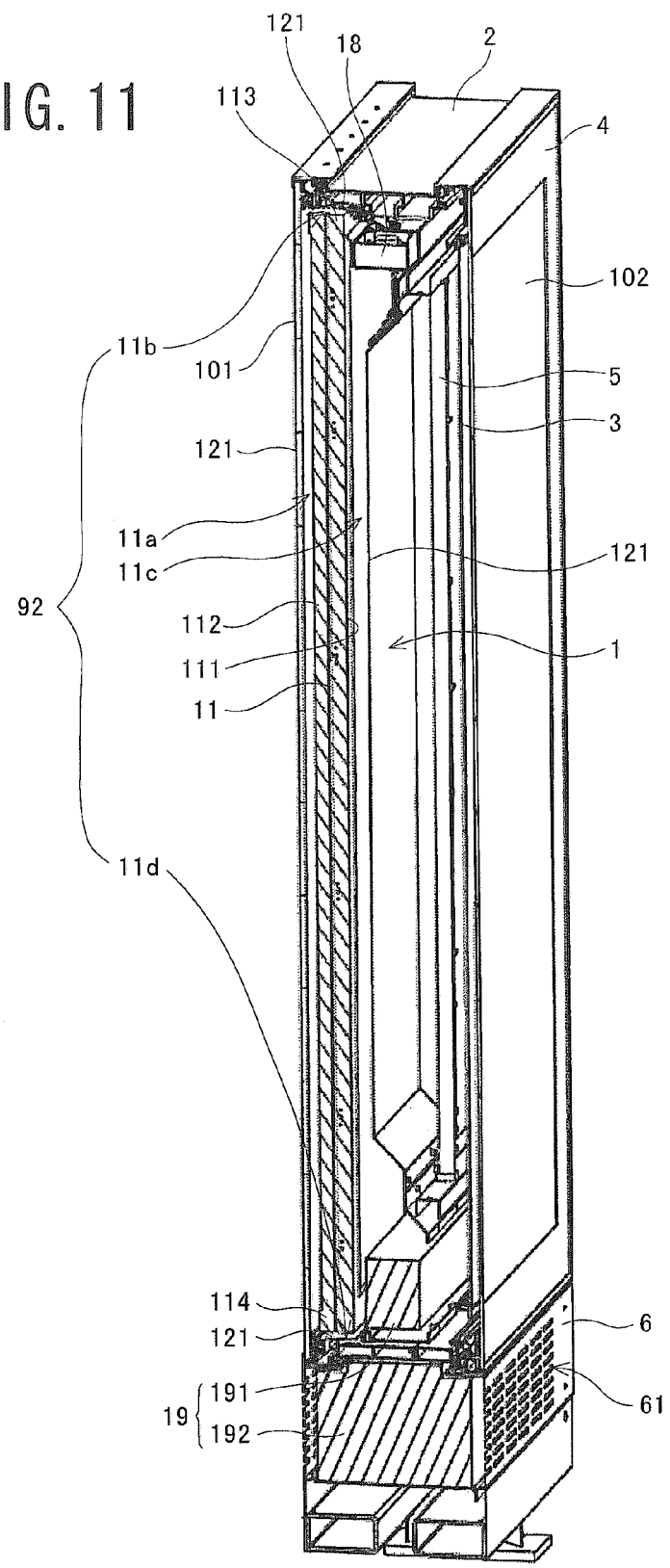
FIG. 11 is a partially cut away perspective view of the display apparatus cut along the line XI-XI shown in FIG. 4.
Figure 12:
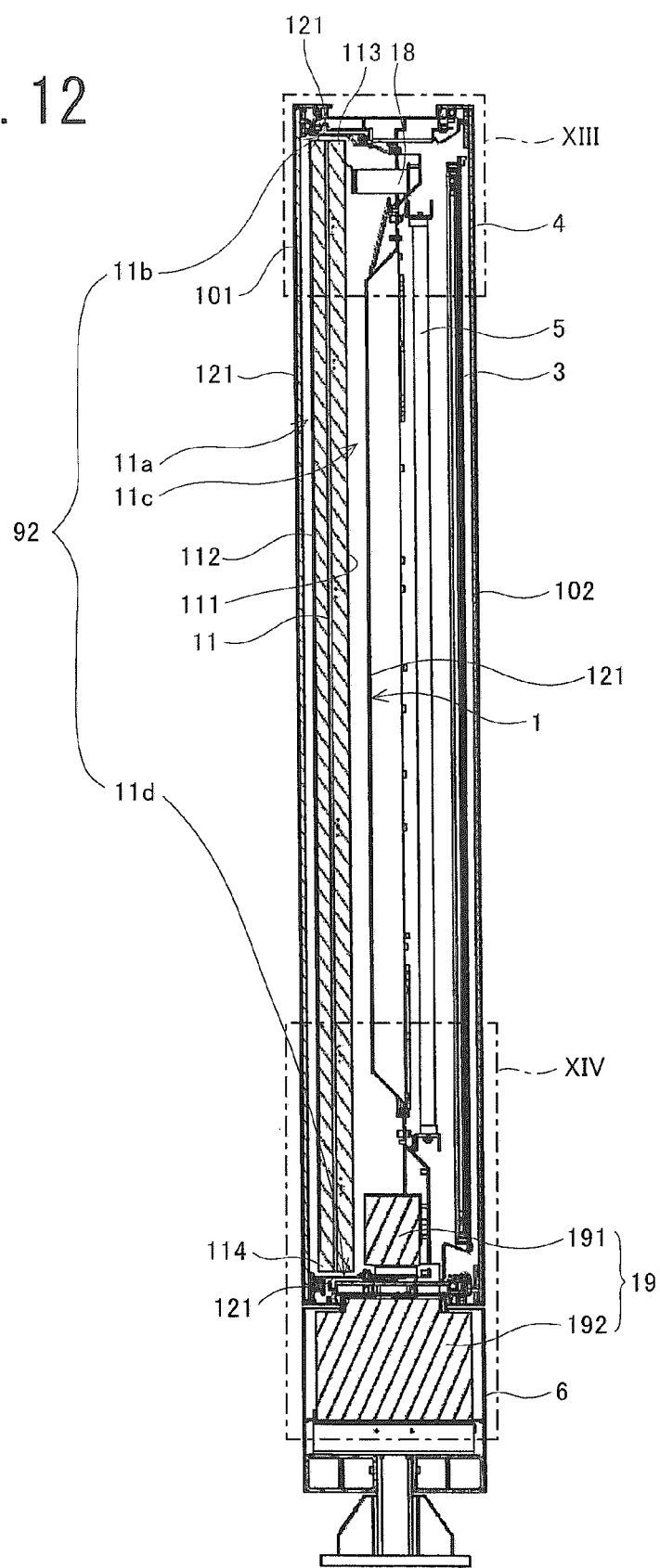
FIG. 12 is a cross sectional view of the display apparatus taken along the line XI-XI shown in FIG. 4.

Further, the accommodation part 121 has a circulation path 92 (cf. FIGS. 11 and 12) inside. The path 92 comprises spaces 11a to 11d so that air can circulate around the display panel 11 as discussed later. In particular, inside the accommodation part 121, there are: a space 11a between it's inner wall and the display screen 112; a space 11b between the inner wall and an upper end 113 of the panel 11; a space 11c between the inner wall and a back 111 of the panel 11; and a space 11d between the inner wall and a lower end 114 of the panel 11. The spaces 11a to 11d are connected into a loop in this order surrounding the panel 11. The space 11a extends in a vertical direction as shown in FIGS. 11 and 12. In FIGS. 11 and 12, the heat pipes 13 and the heat collecting fins 17 are not illustrated in order to show the circulation path 92 clearly. The same applies in FIGS. 13 and 14 which are discussed afterwards.

By forming the circulation path 92 as described above, heat generated on the display screen 112 side of the display panel 11 can easily move to the back 111 side of the display panel 11 by passing through the circulation path 92.

Both the aeration paths 122, 123 are arranged outside the accommodation part 121 and they communicate with the exterior of the housing 12. In detail, as shown in FIG. 4, the path 122 is formed on a side wall 121a of the accommodation part 121, and extends along the side wall 121a, that is, along a vertical direction. The path 123 is formed on a side wall 121b of the accommodation part 121 which is on the other side of the side wall 121a, and extends along the side wall 121b, that is, along a vertical direction. By forming these paths 122 and 123 along the side walls 121a and 121b respectively, increase in thickness of the display apparatus 1 can be avoided.

Figure 6:
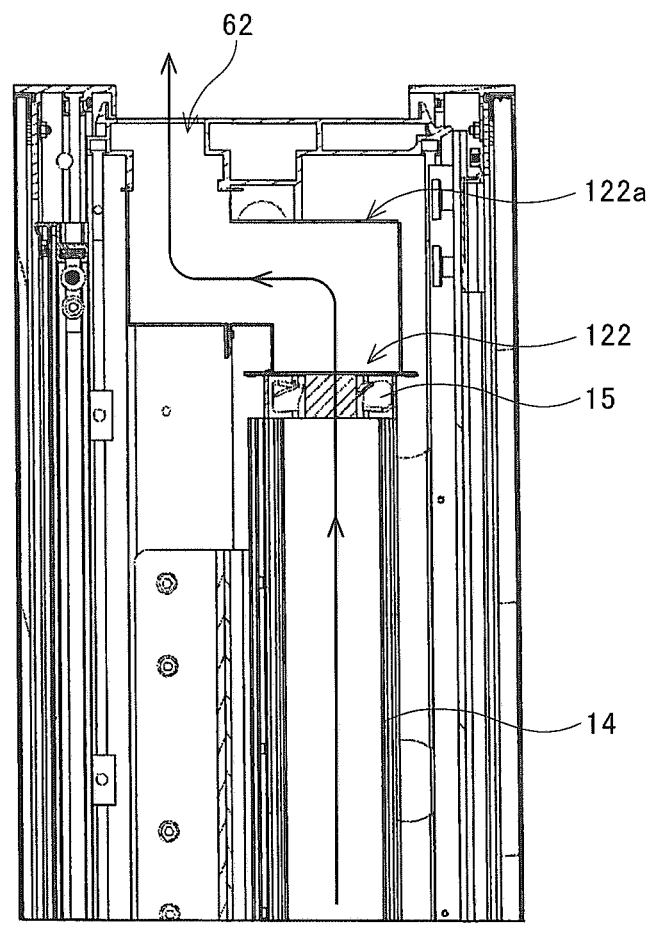
FIG. 6 is a cross sectional view of the display apparatus taken along the line VI-VI shown in FIG. 4.
Figure 8:
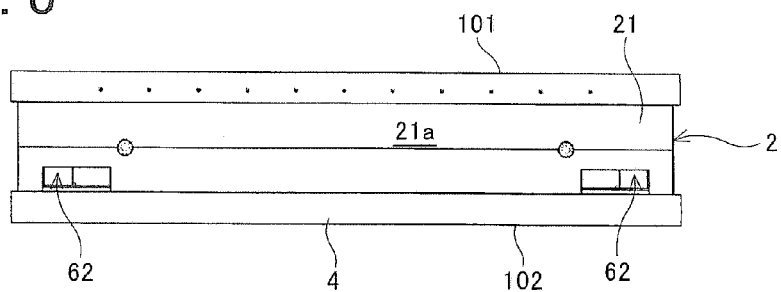
FIG. 8 is a plan view of the image display system.

An upper end part 122a of the aeration path 122 is bended in a crank shape as shown in FIG. 6, and is communicated to the outside of the housing 12 through an aeration hole 62 (cf. FIG. 8) provided on an upper surface 21a of the frame member 21 of the base 2. The same applies to an upper end part 123a of the aeration path 123.

Figure 7:
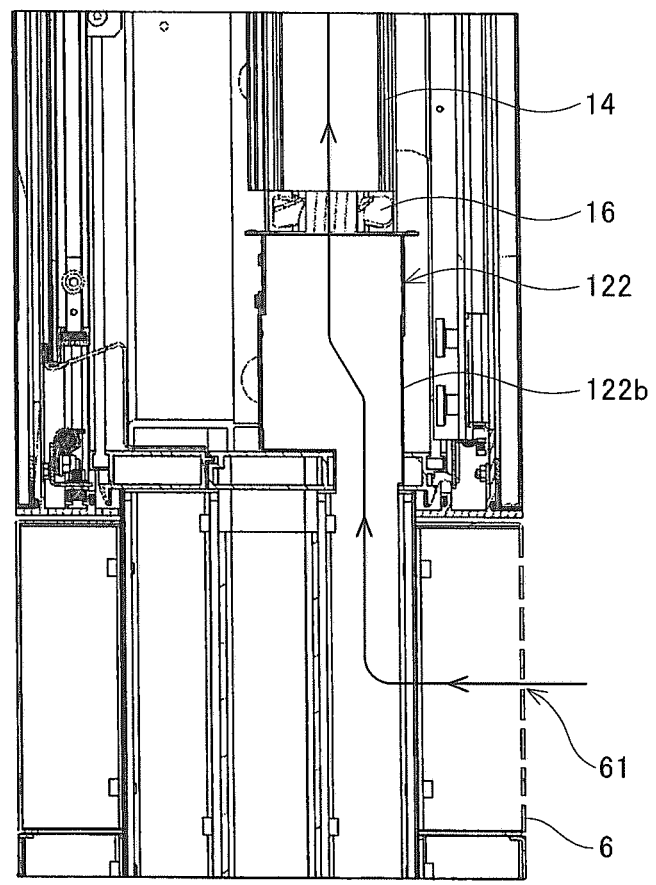
FIG. 7 is a cross sectional view of the display apparatus taken along the line VII-VII shown in FIG. 4.

As shown in FIG. 7, a lower end part 122b of the aeration path 122 leads to the outside of the housing 12 through the aeration holes 61 of the aeration plate 6 placed below the display apparatus 1.

<Heat Pipe 13>

The plurality of heat pipes 13 are arranged in the space 11c on the back 111 side (not shown), and repeatedly arranged on the back 111 of the display panel 11 at a predetermined interval in an extending direction 91 of the aeration path 122 as shown in FIG. 4. In FIG. 4, one set of the heat pipes 13 arranged in such a manner is provided on either side of a central line 111a of the back 111.

Figure 9:
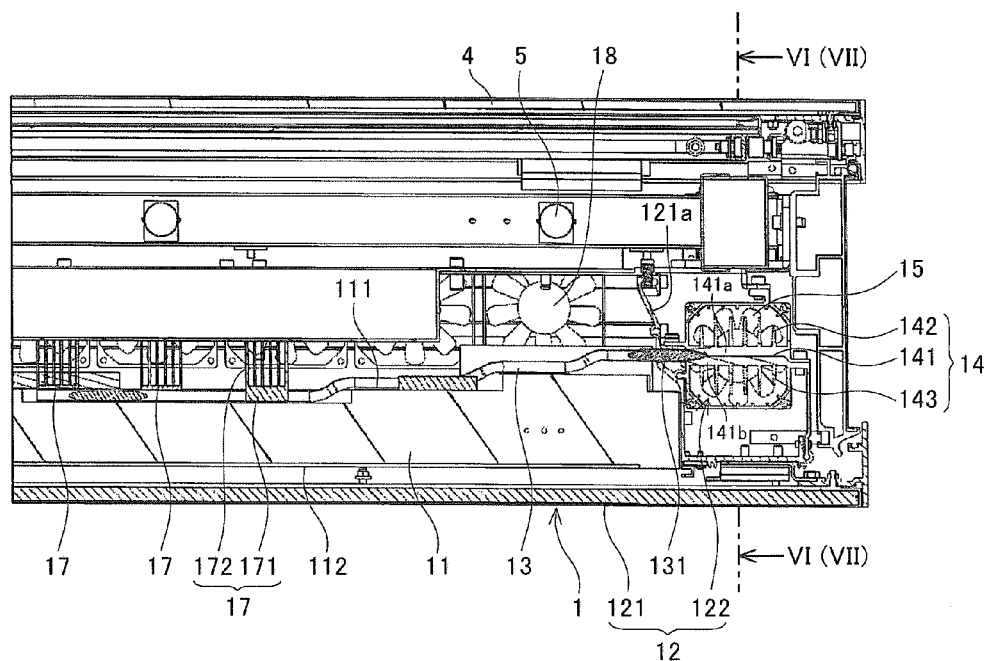
FIG. 9 is an enlarged view of the area IX shown in FIG. 5.

As shown in FIG. 9, the heat pipes 13 arranged on the aeration path 122 side of the central line 111a are extended from the back 111 of the display panel 11 to the aeration path 122, and penetrate the side wall 121a of the accommodation part 121 and extended to the outside of the part 121. The accommodation part 121 has holes through which each of the heat pipes 13 passes. Each of the holes which the heat pipe 13 penetrates is further sealed by silicon rubber. The accommodation part 121 thereby seals around the display panel 11. Similarly, the heat pipes 13 arranged at the aeration path 123 side of the central line 111a are extended from the back 111 to the aeration path 123 (cf. FIG. 5).

By using the heat pipes 13 described above, the heat generated from the display panel 11 can be collected inside the accommodation part 121. Specifically, the heat pipes 13 can collect the heat from the air within the path 92, and can collect the heat of the display panel 11 directly from the back 111. Then, the heat pipes 13 can lead the collected heat to the aeration path 122 or 123 and release the heat into these aeration paths 122, 123. In other words, the heat pipes function as heat exchanging means included in the display apparatus 1.

Also, since the aeration paths 122, 123 communicate with the outside of the housing 12, the heat released to the aeration paths 122, 123 is released to the outside of the housing 12. Therefore, heat generated from the liquid crystal display 10 can be effectively released outside.

Further, since the heat pipes 13 are arranged in predetermined intervals on the back 111 of the liquid crystal display, the heat can be collected from the whole back 111 of the display panel 11. Thereby, cooling efficiency of the display apparatus 1 increases.

Inside the heat pipes 13, the coolant for heat exchange (e.g., fluid such as water) is placed. Therefore, from a view of raising the heat exchange efficiency of the heat pipes 13, it is desirable to arrange the heat pipes 13 so that they extend obliquely upward toward the aeration path 122 or 123 from inside of the accommodation part 121 as shown in FIG. 4.

The heat pipe 13 in the outer side portion is arranged at a higher position than its inner side portion. By the heat from the display panel 11, the coolant in the inner side heat pipe 13 evaporates, and easily rises above toward the outer side since the warm air has a nature of rising above. In the outer side portion, since the heat is deprived from the coolant by air outside the accommodation part 121, the coolant is liquefied again and then falls back lower to inner side portion of the heat pipe 13. Then the coolant is evaporated again.

Further, in order to raise the heat collecting efficiency from the back 111 of the display panel 11, each of the heat pipes 13 are arranged along the back 111 of the display panel 11.

Figure 10:
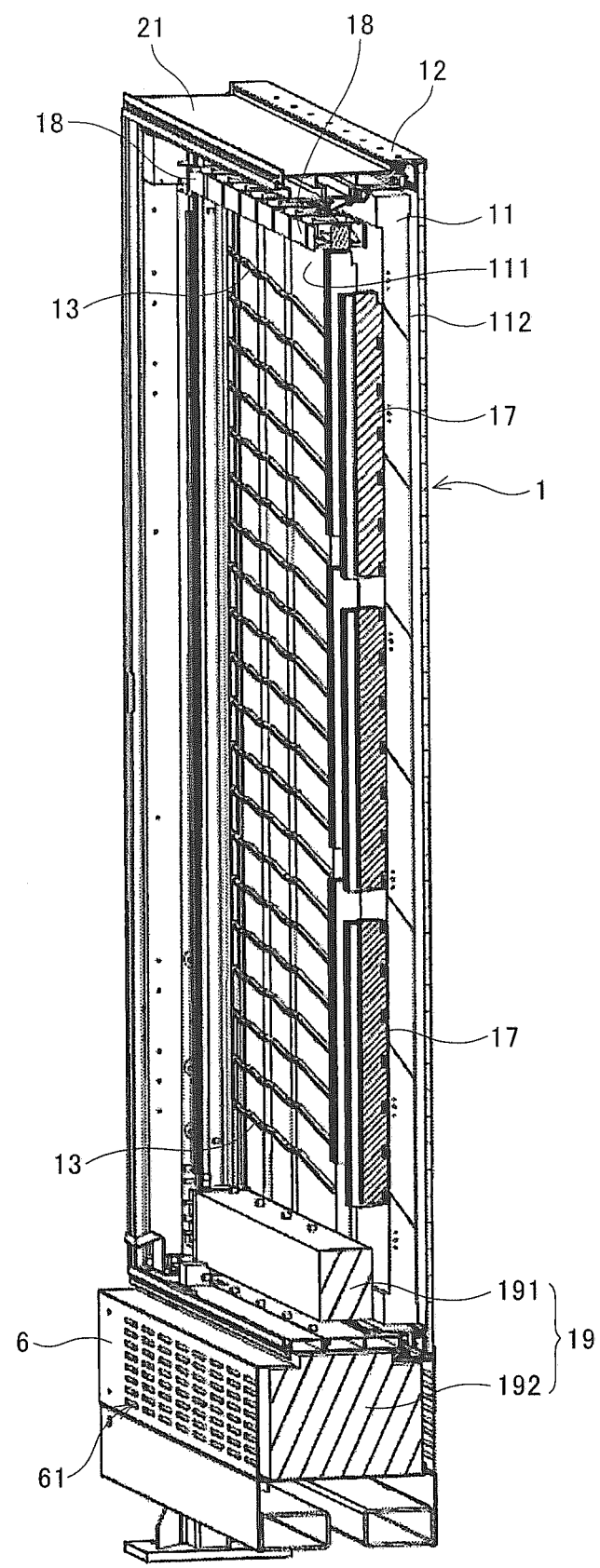
FIG. 10 is a partially cut away perspective view of the display apparatus cut along the line X-X shown in FIG. 4.

As shown in FIGS. 5 and 10, due to a relation between an attachment position of the display panel 11 and electronic components or the circuit, board mounted on the display apparatus 1, a step exists on the back 111 of the display panel 11. Accordingly, each of the heat pipes 13 is bent in a crank shape at the step portion as shown in FIGS. 5 and 10, so that the heat pipes 13 can go along the back 111 of the display panel 11.

Further, each of the heat pipes 13 is arranged keeping a predetermined distance from an adjacent heat pipe 13 as shown in FIG. 4, and these pipes 13 protrude into the aeration paths 122, 123. Thus, also in the inside the aeration path 122, the heat pipes 13 are arranged repeatedly in the aeration path 122 in the direction 91. Therefore, the heat collected by the heat pipes 13 can be released inside the aeration paths 122, 123 dispersedly. As a result, the heat exchanging (heat dissipation) efficiency of the heat pipes 13 inside the aeration paths 122, 123 is increased.

<Air Conditioner 19>

The air conditioner 19 comprises an evaporator 191 and a condenser 192 as shown in FIGS. 2, 10, 11, and 12. The evaporator 191 collects heat, and the collected heat is released by the condenser 192. Further, the air conditioner 19 comprises a compressor which is not illustrated.

The evaporator 191 is arranged inside the accommodation part 121. Specifically, the evaporator 191 is arranged in the space 11c on the back 111 side of the display panel 11 at a position adjacent to the lower end 114 of the display panel 11.

In order to avoid limitations such as decrease in size of the display screen 112 or increase in size of the display apparatus 1, it is preferable to arrange the evaporator 191 on the back 111 side as described above.

As shown in FIGS. 10 to 12, the condenser 192 is arranged outside the accommodation part 121. Specifically, the condenser 192 is arranged at a position below the accommodation part 121 facing the aeration plate 6.

Since the evaporator 191 and the condenser 192 have high heat exchange efficiency, heat generated from the display panel 11 is efficiently collected by the evaporator 191 by the air circulating process, and then the heat collected by the evaporator 191 is efficiently released by the condenser 192 to the outside via the aeration holes 61. Therefore, it can prevent decrease of the function of the liquid crystal display 10 due to the temperature increase of the display panel 11.

As described above, the air conditioner 19 functions as a heat exchanger included in the display apparatus 1. Instead of the air conditioner 19, other means which can exchange heat with the air flowing the circulation path may be employed.

<Circulating Fan 18>

The circulating fans 18 are fans for circulating air inside the circulation flow path 92. As shown in FIGS. 4, 11 and 12, the circulating fans 18 are arranged in the space 11c on the back 111 side near the upper end 113 of the display panel 11.

Figure 13:
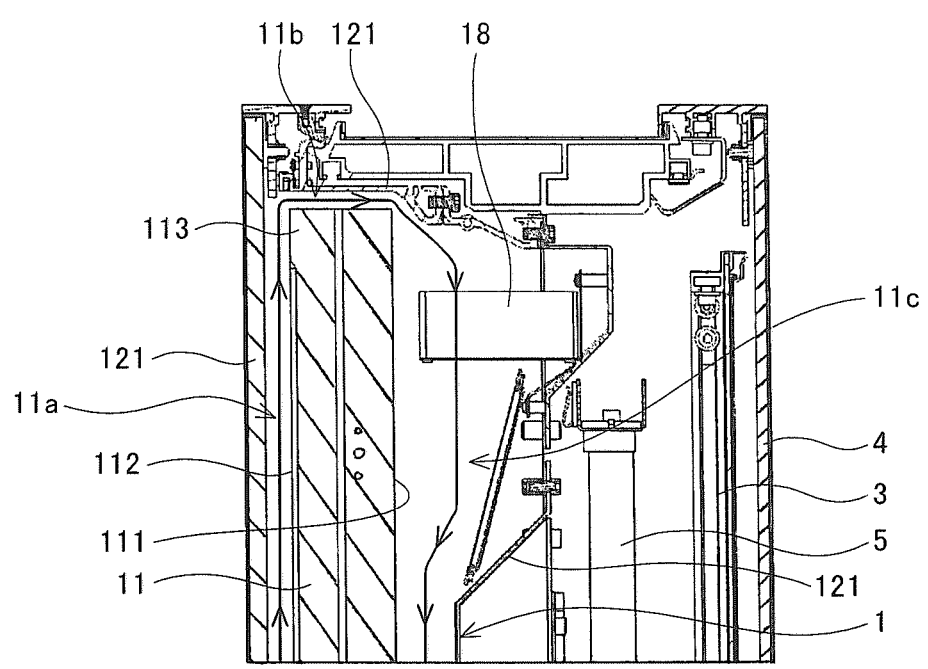
FIG. 13 is an enlarged view of the area XIII shown in FIG. 12.
Figure 14:
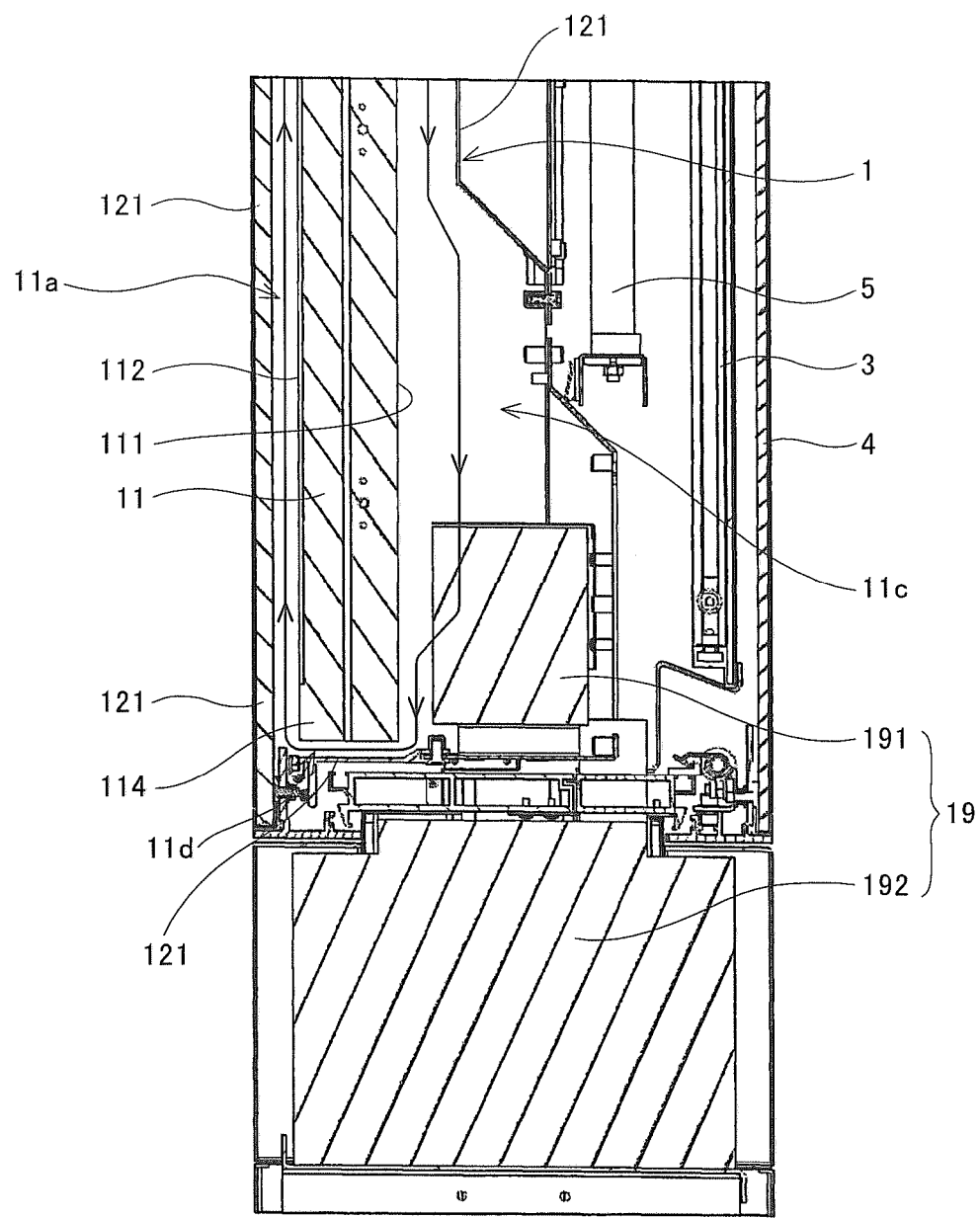
FIG. 14 is an enlarged view of the area XIV shown in FIG. 12.

Specifically, as shown in FIGS. 13 and 14, the circulating fans 18 circulates the air in a direction shown by the solid line arrows along the circulation flow path 92. That is, by driving the fans 18, the air in the space 11a (the display screen 112 side) flows bottom up and passes the space 11b (the upper end 113 side), and then flows into the space 11c as shown in FIG. 13. The air in the space 11c returns to the space 11a via the space 11d on the lower end 114 side as shown in FIG. 14.

According to the fans 18, the air in the display screen 112 side can be led to the back 111 side. Therefore, the heat generated on the display screen 112 is easily led to the back 111 side via the path 92.

By leading the heat to the back 111 side, the heat in the front side of the panel 11 is easily collected by the heat pipes 13 and the evaporator 191. Therefore, the heat collection efficiency in the heat pipes 13 and the heat exchange efficiency in the evaporator 191 increases, thereby the cooling efficiency of the display apparatus 1 is increased.

Further, in this embodiment, since the air of the space 11a along the display screen 112 of the display panel 11 flows from bottom up, which corresponds to the warm air's nature, the air in the space 11a can flow upwards efficiently. Therefore, air can easily circulate the circulation flow path 92, and the heat generated in the display screen 112 of the display panel 11 can be led efficiently to the heat pipe 13 and the evaporator 191. As a result, the heat exchanging efficiency or heat collecting efficiency at the heat pipes 13 and the evaporator 191 increases. Accordingly, the cooling efficiency of the display apparatus 1 increases.

Further, by arranging the fans 18 near the upper end 113 of the display panel 11 as described above, the air in the path 92 is circulated efficiently. The reason is described below.

In the portion where the circulation flow path 92 is widened in the direction perpendicular to the air flowing direction, the air resistance is low. Specifically, as shown in FIG. 13, the space 11b on the upper end 113 side is narrow, and then the path 92 is widened at the entrance of the space 11c on the back 111 side. Thus, the air in the upper end 113 side is led to the back 111 side easily.

For a certain reason, the apparatus 1 may be designed so that the space 11b on the upper end 113 side is widened, however, the space 11a on the display screen 112 side needs to be narrow in order to keep the display apparatus 1 flat. If the space 11b is wider than the space 11a, it is preferred to arrange the circulating fans 18 near the exit of the space 11a.

Instead of the circulating fans 18, other circulating means having a similar function may be applied.

<Radiating Fin 14>

A radiating fin 14 is arranged inside the aeration path 122 as shown in FIGS. 5 and 9, and is connected to a portion 131 of the heat pipe 13 which protrudes into the aeration path 122. As shown in FIGS. 4, 6 and 7, the radiating fin 14 extends from the upper end part 122a to the lower end part 122b of the aeration path 122.

Specifically, as shown in FIG. 9, the fin 14 comprises a base part 141 and fin parts 142, 143. The base part 141 extends in the direction 91 (see FIG. 4) from the upper end part 122a to the lower end part 122b of the path 122, and every heat pipe 13 is connected to the base part 141 (not shown) at the portion 131. The fin parts 142, 143 are connected to respective sides of the base part 141.

Further, as shown in FIG. 9; the base part 141 of the radiating fin 14 comprises two base members 141a, 141b connected to the respective fin parts 142, 143. Each of the base members 141a, 141b has a semicylindrical groove so that when the members 141a, 141b are joined together, the heat pipe can be fitted in between. Therefore, it can connect the radiating fin 14 to the heat pipes 13 only by sandwiching the heat pipes 13 from both sides with the base members 141a, 141b. Therefore, the radiating fin 14 can be connected to the heat pipes 13 easily.

A radiating fin 14 is provided also in the aeration path 123 similarly to the fin 14 provided in the aeration path 122 (cf. FIG. 4).

According to the radiating fins 14 described above, the heat is efficiently released from the heat pipes 13 to the aeration path 122 or 123 via the fins 14, thereby the cooling efficiency of the display apparatus 1 is increased. Instead of the fins 14, the other heat releasing members having similar function to the radiating fins 14 may be applied.

<Aeration Fans 15, 16>

The aeration fan 15 is arranged in the upper end part 122a of the aeration path 122 as shown in FIGS. 4 and 6, and the aeration fan 16 is arranged in the lower end part 122b of the aeration path 122 as shown in FIGS. 4 and 7.

The aeration fans 15 and 16 pass the air in the aeration path 122 to the same direction. In detail, the aeration fan 15 exhausts the air in the aeration path 122 to the outside of the housing 12 via the aeration hole 62 as shown in FIG. 6, and thereby passes the air in the aeration path 122 from bottom up. The aeration fan 16 inhales the air outside of the housing 12 into the aeration path 122 via the aeration holes 61 as shown in FIG. 7, thereby making the air in the aeration path 122 flow from bottom up. In FIGS. 6 and 7, the flow of the air is indicated by solid line arrows.

Thereby, the air flow in a single direction inside the aeration path 122 is generated, and therefore the heat radiating efficiencies of the heat pipes 13 and the radiating fin 14 in the aeration path 122 rises. Thus, the heat led into the aeration path 122 by the heat pipes 13 is released to the outside of the housing 12 efficiently.

Similarly, these fans 15, 16 are arranged also in the aeration path 123 (cf. FIG. 4), and make the air in the aeration path 123 flow from bottom up. Thus, the heat led into the aeration path 123 by the heat pipes 13 is also released to the outside of the housing 12 efficiently.

As described above, since the air in the paths 122 and 123 flows from bottom up by the fans 15, 16, conforming with a property of the air of rising when warmed, the air in the paths 122 and 123 flows from bottom up efficiently. Therefore, the heat radiating efficiencies of the heat pipes 13 and the radiating fins 14 in the paths 122, 123 increase.

Instead of these fans 15, 16, other fan means that can generate air flow in the aeration path 122 may be applied.

<Heat Collecting Fin 17>

As shown in FIG. 4, the heat collecting fin 17 is connected ranging over the plurality of heat pipes 13 in the accommodation part 121. In particular, as shown in FIG. 9, each of the fins 17 comprises a base 171 and a fin part 172. The base 171 extends over the heat pipes 13, and contacts each of them. The fin part 172 is connected perpendicularly to the surface of the base 171, and is stretched from one end of the base 171 to the other end of the base 171 in the longitudinal direction of the base 171.

According to the fins 17 described above, it can collect the heat released out from the display panel 11 to the circulation path 92 efficiently and can lead the collected heat to the heat pipes 13. Thereby, the function of the heat pipes 13 as the heat exchange means is enhanced, and the cooling efficiency of the display apparatus 1 rises.

In FIG. 4, it is shown that the heat collecting fins 17 are connected only with the heat pipes 13 in the aeration path 122 sides from the center (central line 111a). However, the heat collecting fins 17 are connected with the heat pipes 13 in the aeration path 123 side as well.

Instead of the above fins 17, other heat collecting members having similar function to the fins 17 may be applied.

3. Modification 3-1. Modification 1

In the display apparatus 1 described above, the plurality of heat pipes 13 are arranged in predetermined intervals in the direction 91 (cf. FIG. 4), however, other forms may be applied. For example, the heat pipes 13 may be arranged at different intervals. However, from a view point of increasing the cooling efficiency of the display apparatus 1, it is preferable to arrange heat pipes 13 all over the back 111 of the display panel 11 as in the above mentioned display apparatus 1 described above so that the heat can collect from a whole back 111 side.

3-2. Modification 2

According to the display apparatus 1 described above, the air in the aeration paths 122 and 123 are passed from bottom up by the aeration fans 15, 16, however, the air may be passed flow from top down. For example, depending-on the environment of the installation place of the image display system having the display apparatus 1, it may be better to pass the air better from top down.

In the display apparatus 1 described above, two aeration fans are arranged in each of the aeration paths 122 and 123. Instead, only one of them may be arranged. Or, three or more fans may be arranged in each of these paths.

Further, the aeration fans 15 are arranged at the upper end parts 122a and 123a of the aeration paths 122 and 123, and the aeration fans 16 are arranged in the lower end parts 122b and 123b of the aeration paths 122 and 123, but they may be arranged in other positions. However, they should be arranged so that the air in the aeration paths 122 and 123 can be emitted outside of the housing 12.

3-3. Modification 3

According to the display apparatus 1 described above, the circulation path 92 is constituted from: the space 11a on the display screen 112 side; the space 11b on the upper end 113 side; the space 11c on the back 111 side; and the space 11d on the lower end 114 side. Instead, the other course surrounding the panel 11 may form the path 92. For example, a space may be formed between the side surface of the display panel 11 and the side walls of the accommodation part 121 (i.e. 121a and 121b), so that the air circulates between the space 11a and the space 11c via this space.

Further, according to the display apparatus 1 described above, the air in the space 11a on the display screen 112 side is passed from bottom up by the circulating fans 18. However, the air may be passed from top down the circulating fans 18. In such case, it is preferable to arrange the fan 18 near the lower end 114 of the display panel 11. The fans 18 may be arranged in the other position instead of the position near the upper end 113 or the lower end 114 of the display panel 11.

The present invention is not limited to the foregoing embodiment in construction but can be modified variously within the technical scope as set forth in the appended claims. For example, as well as the liquid crystal display, the technique described above can be applied in a display apparatus which includes the flat-panel display such as a plasma display or an organic electroluminescence (Electro-Luminescence) display.

What is claimed is:

1. A display apparatus comprising:
a flat display including a display panel;
a housing having a sealing part that seals a periphery of the display panel and permits a display screen of the display panel to be viewed from outside, wherein the housing has an aeration path that is arranged outside the sealing part and communicates with the outside air;
a circulation path formed in the sealing part and configured to allow a flow of an air to be circulated around the display panel;
a circulating fan disposed in the circulation path and adapted for circulating the air flow through the circulation path;
a plurality of heat pipes which extend from a rear surface of the display panel to the aeration path; and
one or more heat collecting fins directly connected to at least a portion of the plurality of heat pipes in the circulation path with each of the one or more heat collecting fins connected to at least more than one of the plurality of heat pipes; and wherein
the circulation path has a first path extending in a generally vertical direction along a front surface of the display panel and a second path extending in a generally vertical direction along the rear surface of the display panel, the aeration path extends along the side surface of the sealing part in a generally vertical direction, the plurality of heat pipes are arranged along the aeration path extend obliquely upward into the aeration path, and each of the heat pipes has one end portion positioned in direct contact with the rear surface of the display panel and the other end portion connected to the aeration path.

2. The display apparatus according to claim 1, wherein the plurality of heat pipes are arranged in repetition on the rear surface of the display panel in an extending direction of the aeration path.

3. The display apparatus according to claim 1, further comprising a heat releasing member connected more of heat pipes in the aeration path.

4. The display apparatus according to claim 1, further comprising a fan unit that makes air in the aeration path flow from one end to the other end of the aeration path.

5. The display apparatus according to claim 4, wherein the fan unit comprises fans disposed on the one end and the other end of the aeration path, and the fans make the air in the aeration path flow in the same direction.

6. The display apparatus according to claim 4, wherein the aeration path extends in a generally vertical direction, and the fan unit makes the air in the aeration path flow from bottom to top in the generally vertical direction.

7. A display apparatus comprising:
a display panel;
a housing that seals the display panel while making a display surface of the display panel viewable from outside;
an aeration path extending vertically on a side surface side of the display panel;
a heat pipe arranged on a rear surface of the display panel and extends to the aeration path;
a circulation path configured to allow a flow of an air to be circulated around the sealed display panel;
a circulating fan disposed in the circulation path and adapted for circulating the air flow through the circulation path;
a fan unit that passes air in the aeration path from one end to the other end of the aeration path; and
one or more heat collecting fins directly connected to at least a portion of the plurality of heat pipes on the rear surface of the sealed display panel with each of the one or more heat collecting fins connected to at least more than one of the plurality of heat pipes: and wherein
the plurality of heat pipes are arrange along the aeration path and extends obliquely upward into the aeration path,
the circulation path has a first path extending in a generally vertical direction along a front surface of the display panel and a second path extending in a generally vertical direction along the rear surface of the display panel, and
each of the heat pipes has one end portion positioned in direct contact with the rear surface of the display panel and the other end portion connected to the aeration path.

* * * * *